United States Patent [19]

Imai et al.

[11] Patent Number: 5,444,311
[45] Date of Patent: Aug. 22, 1995

[54] INTEGRATED CIRCUIT AND ITS CONNECTING CIRCUIT

[75] Inventors: Tadashi Imai; Hideki Oto, both of Saitama, Japan

[73] Assignee: Kabushiki Kaisha Toshiba, Kawasaki, Japan

[21] Appl. No.: 574,781

[22] Filed: Aug. 30, 1990

[30] Foreign Application Priority Data

Aug. 31, 1989 [JP] Japan .................................. 1-225194

[51] Int. Cl.$^6$ ............................................. H03K 3/26
[52] U.S. Cl. ..................................... 327/565; 331/60; 327/564; 326/21
[58] Field of Search .................. 307/303.1, 303.2, 443, 307/262; 331/60; 330/80

[56] References Cited

U.S. PATENT DOCUMENTS

| | | | |
|---|---|---|---|
| 4,023,053 | 9/1977 | Shimizu et al. | 307/303.1 |
| 4,542,309 | 9/1985 | Klein et al. | 307/262 X |
| 4,620,162 | 10/1986 | Ouitkat et al. | 331/60 |
| 5,063,358 | 11/1991 | Valo et al. | 331/60 |

FOREIGN PATENT DOCUMENTS

| | | |
|---|---|---|
| 0198621 | 10/1986 | European Pat. Off. . |
| 0214307 | 3/1987 | European Pat. Off. . |
| 0246458 | 11/1987 | European Pat. Off. . |
| 3316184 | 8/1985 | Germany . |
| 2215121 | 9/1989 | United Kingdom . |

OTHER PUBLICATIONS

Electronic Circuits Digital and Analog p. 522, Smith, 1983.
Larry Wakeman, "Vorgange auf leitungen und ihr Einfluss auf HCMOS-Schaltkreise" National Semiconductor, Mar. 1986, 57–63.

*Primary Examiner*—Robert J. Pascal
*Assistant Examiner*—Reginald A. Ratliff
*Attorney, Agent, or Firm*—Cushman Darby & Cushman

[57] ABSTRACT

In this invention, in arranging a balance type input terminal group or output terminal group in an integrated circuit, the formation is provided with one terminal for grounding and two signal terminals adjacent to this grounding terminal on both sides. In connecting the output terminal group of the first integrated circuit and the input terminal group of the second integrated circuit with each other in such formation, the grounding terminals themselves and signal terminals themselves are respectively connected in one to one. Further, in the integrated circuit formed as mentioned above, among the bonding wires connecting the balance type input terminal group or output terminal group with an electrode group of an inner chip, the two bonding wires connecting the chip with the signal terminals are wired symmetrically with the bonding wire connecting the chip with the grounding terminal as a center.

4 Claims, 2 Drawing Sheets

INTEGRATED CIRCUIT AND ITS CONNECTING CIRCUIT

TITLE OF THE INVENTION

INTEGRATED CIRCUIT AND ITS CONNECTING CIRCUIT

BACKGROUND OF THE INVENTION

Field of the Invention:

This invention relates to an integrated circuit and its connecting circuit characterized by a terminal structure of a balancing operating high frequency integrated circuit and its internal connection and also characterized by a connecting method with the other same kind of the integrated circuit.

Description of the Related Art

With the recent development of semiconductor devices, high frequency circuits of VHF bands and UHF bands tend to be made integrated circuits.

There is a case that a high frequency circuit is formed of a first integrated circuit (mentioned as an IC hereinafter) forming, for example, a PLL-FM demodulating circuit and a second IC forming a differential type high frequency amplifying circuit. In such case, the first IC has a high frequency signal input terminal and a demodulating signal output terminal and has within the IC a demodulating circuit by a PLL including a voltage controlled oscillator (mentioned as a VCO hereinafter) and phase comparator. The above mentioned input terminal makes a balanced input and the output terminal makes a balanced output. Also, the second IC has an input terminal of a balanced input and an unbalanced output terrminal.

The input signal for the first IC is fed to the balanced input terminal of the first IC, for example, through a balance-unbalance converting balloon transformer or the like.

The first IC has also a terminal for connecting a tank circuit to a VCO, terminal for grounding and terminal for a power source.

The signal from the balanced output terminal of the first IC is led to the balanced input terminal of the second IC, for example, through a lag type lead filter.

The second IC balances and amplifies the input signal and leads an unbalanced output out of the output terminal. This second IC also has an earthing terminal and power source terminal.

As mentioned above, in making a high frequency circuit an IC, the interior of the IC fundamentally takes the fomation of a differential amplifier but the high speed device to be used for this is so low in the pressure-resistance that a low voltage source is used and therefore the input-output dynamic range of the IC can not be made high. Therefore, the IC formed of a differential amplifier is adapted to the balancing operation. On the other hand, the circuit (for example, the balloon transformer input winding or lead filter) externally connected to the IC is generally used in the unbalancing operation.

When the high frequency earthing surface is made large, the grounding potential will be reduced and the noise induction to the signal line from the above mentioned power source line or the like will reduce but, within the IC, the grounding surface is so small that the reduction of the grounding potential is almost impossible. Therefore, in the IC, there is made a method of removing the same phase noises by balancing operating the circuit. If the circuit is not operated to be balanced but is forcebly operated to be unbalanced by grounding one of the balanced input terminals of the IC, an amplitude twice as large as in the case of the balancing operation will be required and therefore the input dynamic range will be a problem. Also, there will be a disadvantage that the bonding wire or the like within the IC at the other input terminal that is grounded will have a new impedance and the induction amount from the grounded terminal will become large.

Now, the balancing operating circuit has the above mentioned effect but can not remove the noise caused by the induction between the signal terminals. Therefore, for example, a vacant terminal is provided between the balanced input terminals so that the induction between the signal terminals may be reduced or the distance between the balanced output terminals of the IC is made large to separate the input or output terminals of the IC from each other.

However, if such vacant terminal is made, though the circuit is made an integrated circuit and the integrated degree is elevated, the number of the terminals will increase, the package size will become large and the other functions will be restricted to be mounted.

Also, when a multi-terminal package is used, the lengths of the internal bonding wires from such respective terminals as the grounding terminal, voltage source terminal and signal terminal to the chip within the IC will become so large as to deteriorate the high frequency characteristic and, as the respective lengths are different, the effect of the balancing operation to eliminate the same phase induction noises (from the power source line or the like) will reduce.

As explained above, in the conventional high frequency integrated circuit, a vacant terminal is provided between two signal terminals for a balancing operation so that the induction between the signal terminals may be reduced. In consideration of the lengths of the respective bonding wires from the respective signal terminals and grounding terminal to the internal chip, there have been problems that, as the lengths are respectively different, the high frequency characteristic will deteriorate, the same phase induction noise will not be well eliminated and the number of the terminals will become large.

SUMMARY OF THE INVENTION

An object of the present invention is to provide an integrated circuit and its connecting circuit wherein the high frequency characteristic and induction noise eliminating performance are improved.

Another object of the present invention is to provide an integrated circuit wherein the number of terminals can be saved.

That is to say, the first invention is characterized in that it has a first terminal for grounding and a pair of signal terminals provided adjacently to this first terminal on both sides and signal input or signal output terminals are made of this pair of terminals.

The second invention is characterized by comprising a first integrated circuit having a first terminal for grounding and a pair of signal output terminals provided adjacently to this first terminal on both sides, a second integrated circuit having a second terminal for earthing and a pair of signal input terminals provided adjacently to this second terminal on both sides and a means for commonly connecting and grounding the above mentioned first and second grounding terminals and connecting the above mentioned pair of signal output terminals respectively to the above mentioned corresponding pair of signal input terminals.

The third invention is characterized in that it has a first terminal for grounding and a pair of signal terminals provided adjacently to this first terminal on both sides, signal input or signal output terminals are made of this pair of signal terminals, electrode groups for connecting these first terminal and pair of signal terminals to an internal chip are connected respectively through bonding wires and two bonding wires connecting the chip with the above mentioned pair of signal terminals are arranged symmetrically with each other with the bonding wire connecting the chip with the first terminal as a center.

DETAILED DESCRIPTION OF THE PREFERRED EMBODIMENTS

Figure 1:
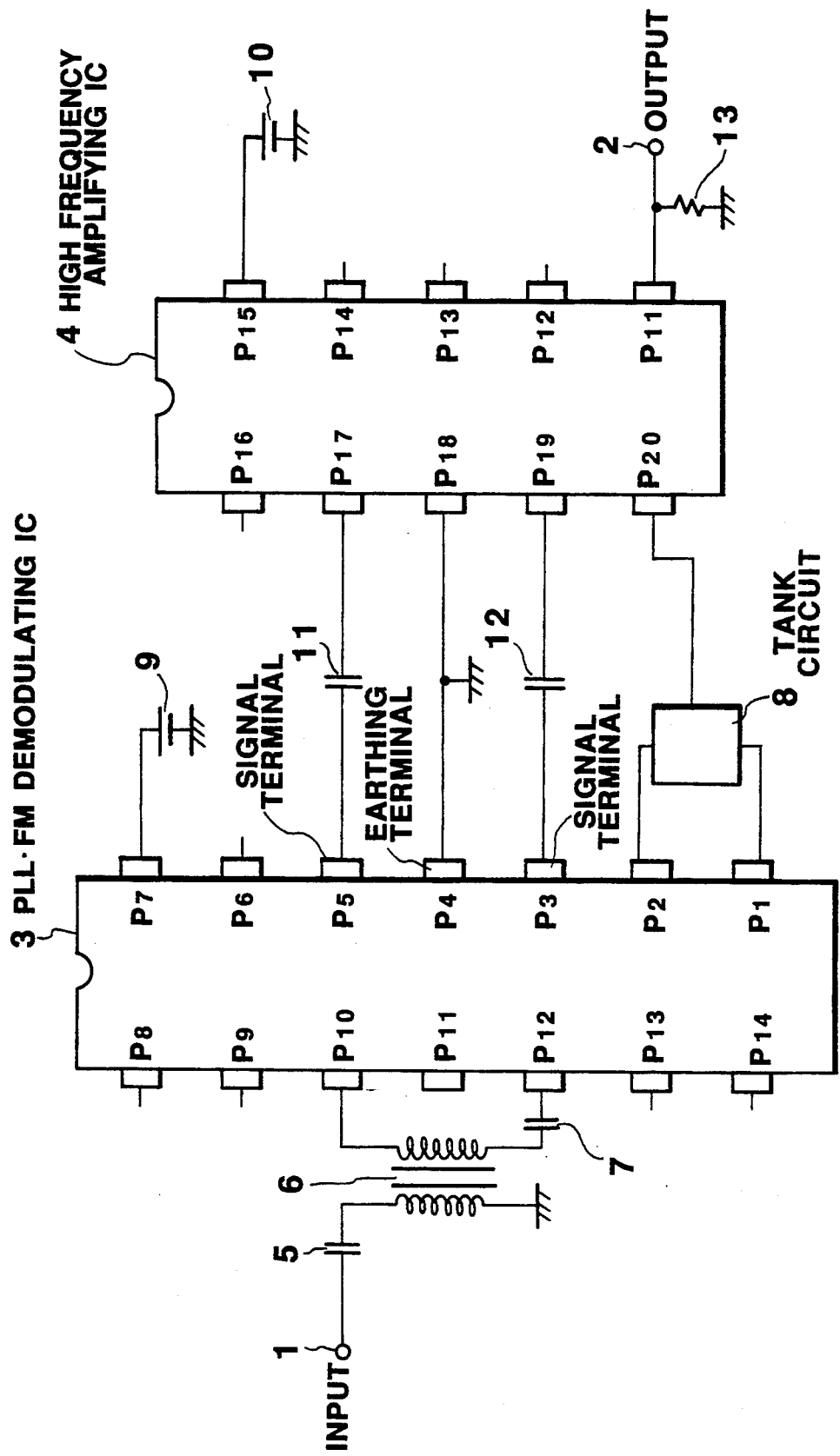
FIG. 1 is a formation diagram showing an embodiment of an integrated circuit relating to the present invention.

FIG. 1 shows an embodiment of an integrated circuit and its connecting circuit relating to the present invention.

In FIG. 1, the reference numeral 1 represents a high frequency signal input terminal, 2 represents a demodulated output outputting terminal, 3 represents a PLL-FM demodulating IC including a VCO and phase comparator and 4 represents a differential type high frequency amplifying IC. The IC 3 has balanced input signal terminals P10 and P12, balanced output signal terminals P3 and P5 and an grounding terminal P4. The IC 4 has balanced input signal terminals P17 and P19, unbalanced output signal terminals P11 and P20 and an earthing terminal P18.

The input terminal 1 is connected to an unbalanced input winding of a balance-unbalance converting balloon transformer 6 through a connecting condenser 5. A balanced output winding of the balloon transformer 6 is connected at one end to the balanced input terminal P10 of the IC 3 and at the other end to the balanced input terminal P12 of the IC 3 through a condenser 7.

In the IC 3, the terminals P1 and P2 are VCO tank circuit connecting terminals and a tank circuit 8 is connected to the terminals P1 and P2. The tank circuit 8 is formed of parallel circuits (not illustrated) of a coil and variable capacitor to which the output from the terminal P20 of the IC 4 is to be applied. Terminals P7 and P15 of the IC 3 and IC 4 are power source terminals connected respectively to power sources 9 and 10.

In the two IC3 and IC4, the output terminal P5 and input terminal P 17 are connected with each other and the output terminal P3 and input terminal P19 are connected with each other respectively through condensers 11 and 12 and the connecting line of the grounding terminals P4 and P18 is grounded. By the way, a gain setting resistance 13 is connected to the output terminal P11 of the IC 4.

According to such connecting circuit, in the signal outputting IC3, the output will be fed as in a balance type to the IC 4 and it will not be necessary as before to take the distance between the balanced terminals to be large or to insert a filter or the like earthing the induced signal part. In the induction between the signal terminals P3 and P5 and between the signal terminals P17 and P19, as the terminal distance is spaced by the grounding terminals P4 and P18, the induction can be reduced.

Figure 2:
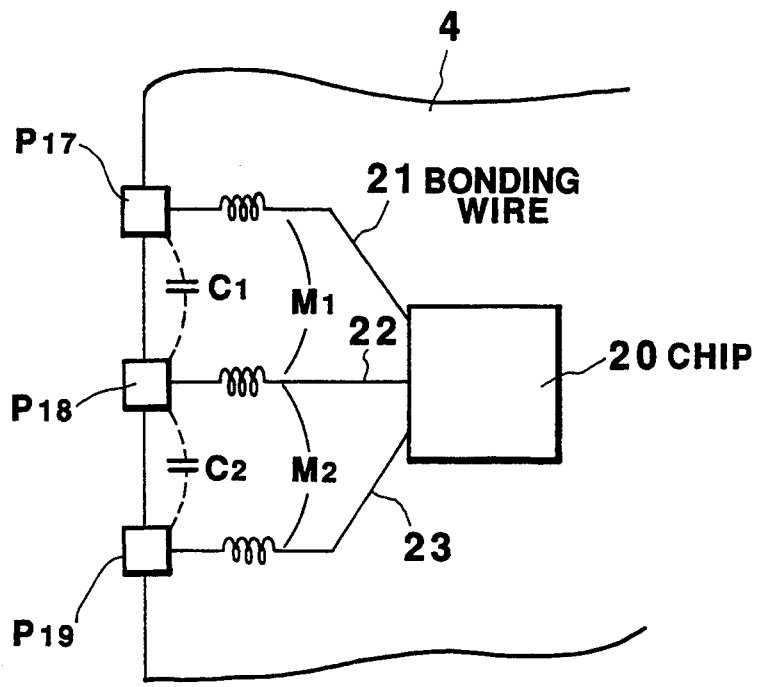
FIG. 2 is an equivalent circuit diagram within the integrated circuit of FIG. 1.

On the other hand, the signal output in the balance type from the IC 3 will be input into the internal chip of the IC 4 through such equivalent circuit represented as in FIG. 2.

FIG. 1 shows a high frequency equivalent circuit by bonding wires up to the internal chip 20 from the input terminals P17 to P19 of the IC 4. In FIG. 2, bonding wires 21, 22 and 23 are connected to the inner chip 20 from the terminals P17, P18 and P19 of the IC 4. Then, between the terminals P17 and P18 and between P18 and P19, package capacitors of capacities $C_1$ and $C_2$ will be respectively present and mutual inductances $M_1$ and $M_2$ between the wires will be present by the inductances by the bonding wires 21, 22 and 23.

The above mentioned capacities and mutual inductances are present otherwise than between the adjacent terminals but are smaller in the value than between the adjacent terminals. Here, the bonding wires 21 and 23 are geometrically symmetrical with each other with the grounding bonding wire 22 in the center. Then, the capacities $C_1$ and $C_2$ and mutual inductances $M_1$ and $M_2$ will be respectively represented by $$C_1 = C_2 = C \ldots \qquad (1)$$

and $$M_1 = M_2 = M \ldots \qquad (2)$$

That is to say, between the terminals P17 and P19 and grounding terminal P18, a coupling by the same capacity C and an inductive coupling by the same inductance L will occur.

Figure 3:
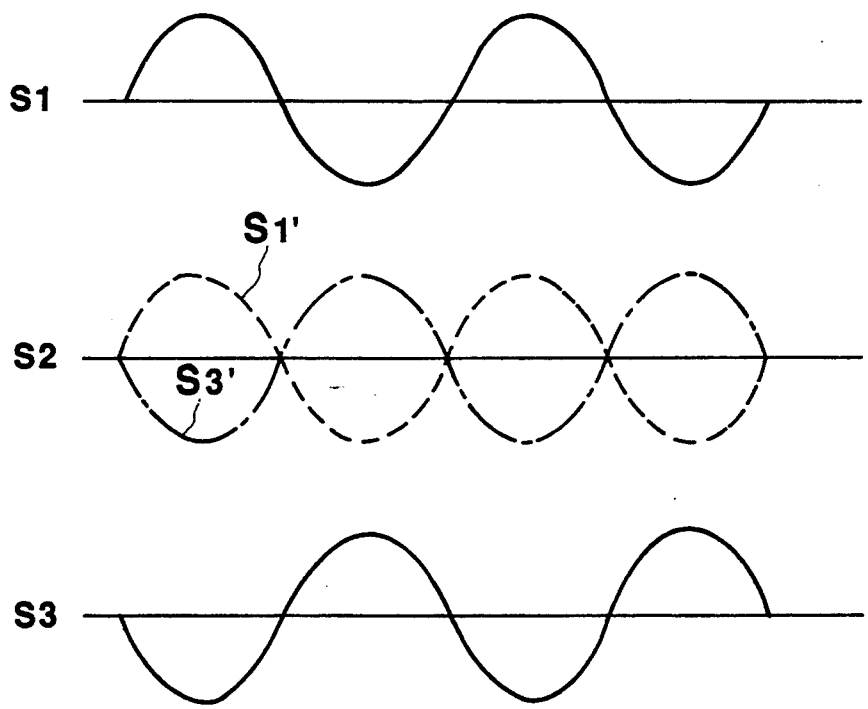
FIG. 3 is a waveform diagram showing an induced noise eliminating operation by the present invention.

Therefore, in case such waveform signals as are shown by $S_1$ and $S_3$ in FIG. 3 are input through the terminals P17 and P19, the waveform appearing in the grounding terminal P18 will be as in $S_2$ in FIG. 3. $S_2$ in FIG. 3 represents a non-signal waveform not appearing in the grounding terminal P18 when signals $S_1$ and $S_3$ of the same amplitudes and reverse phases are induced as in the waveform $S_1'$ represented by the dotted line and the waveform $S_3'$ represented by the one-point chain line and are canceled with each other. Strictly speaking, the signal induced in the grounding terminal P18 will be of a combined sum of the capacity and inductance. Therefore, unless the impedances of the grounding terminal P18 and the opposite ground surface are definite, those signals will not be perfectly canceled with each other. However, if it is assumed that, for example, the same phase inductive coupling is ruling, the signal $S_1$ will substantially coincide with $S_1'$ and $S_3$ with $S_3'$ and the induced components to the grounding terminal P18 will be able to be canceled with each other.

Such relation as in the above mentioned formulas (1) and (2) can be applied also to the terminals P3, P4 and P5 of the IC 3 and the induced signal component in the grounding terminal can be excluded also by the bonding wire to the terminal side from the chip side. That is to say, if the couplings between the terminals are symmetrical with each other with the grounding terminal in the center, the formulas ①  and ② will hold and will be able to be applied to either of the input and output irrespective of their capacity values and inductance values.

In the conventional case, as the balancing signal terminals are adjacent to each other, the input amplitude will be reduced and, as the terminal structure is asymmetrical, $$C_1 \neq C_2 \text{ and } M_1 \neq M_2 \ldots \quad (3)$$

and the high frequency signal will remain in the grounding potential of the IC chip. This is a so-called ground floating state.

Thus, in this embodiment, there are effects that the high frequency performance can be elevated and that, as no vacant terminal is required to be made, the package can be made smaller in the size and can be used for another function.

By the way, the present invention will be able to be applied to the case that the front device has a balanced output and the grounding lines are arranged at equal intervals between the balanced lines irrespectively of the terminal arrangement of the front step devices and the terminal arrangement of the rear step IC's.

As explained above, according to the formation of the present invention, the signal terminals will be separated from each other through an grounding terminal and a distance reducing the direct induction between the signal terminals will be realized. The noises appearing in the grounding terminal due to the signals induced to the grounding terminal respectively from the signal terminals will be canceled with each other by the amplitudes becoming equal and reverse in the phase to each other. Also, the grounding terminal can be used as a reference potential terminal and the number of terminals can be economized. As a result, an IC having no vacant terminal and high in the high frequency characteristics and induced noise eliminating performance can be realized.

What is claimed is:

1. An integrated circuit configuration comprising:
   a first integrated circuit, comprising:
   a first integrated circuit chip;
   a first terminal, formed in said first integrated circuit chip, for grounding said first integrated circuit chip;
   first and second output terminals, formed in said first integrated circuit chip and disposed adjacent to said first terminal on opposite sides of said first terminal, for outputting balanced signals having equal amplitudes and being opposite in phase; and
   a second integrated circuit, comprising:
   a second integrated circuit chip;
   a second terminal, formed in said second integrated circuit chip, for grounding said second integrated circuit chip, said second terminal being coupled to said first terminal; and
   first and second input terminals, formed in said second integrated circuit chip and disposed adjacent to said second terminal on opposite sides of said second terminal and coupled to said first and second output terminals, respectively, for inputting said balanced signals from said first and second output terminals of said first integrated circuit.

2. An integrated circuit configuration according to claim 1, wherein said balanced signals induce, in said second terminal, signals that substantially cancel each other out, thereby causing said second terminal to remain substantially at a ground potential.

3. An integrated circuit configuration according to claim 1, wherein said first and second output terminals are disposed symmetrically on opposite sides of said first terminal.

4. An integrated circuit configuration according to claim 1, wherein said first and second input terminals are disposed symmetrically on opposite sides of said second terminal.

* * * * *